United States Patent [19]
Sato et al.

[11] Patent Number: 6,084,419
[45] Date of Patent: Jul. 4, 2000

[54] METHOD AND APPARATUS FOR INSPECTING SEMICONDUCTOR INTEGRATED CIRCUITS, AND CONTACTOR INCORPORATED IN THE APPARATUS

[75] Inventors: Takashi Sato, Nirasaki; Kunio Sano, Yamanashi-ken, both of Japan

[73] Assignee: Tokyo Electron Limited, Tokyo, Japan

[21] Appl. No.: 09/028,091

[22] Filed: Feb. 23, 1998

[30] Foreign Application Priority Data

Feb. 24, 1997 [JP] Japan .................................. 9-055520

[51] Int. Cl.$^7$ .................. G01R 31/02; G01R 31/302; G01R 1/04
[52] U.S. Cl. .................. 324/754; 324/750; 324/758; 324/158.1
[58] Field of Search .................. 324/754, 758, 324/158.1, 73.1, 765, 750, 760

[56] References Cited

U.S. PATENT DOCUMENTS

| | | | |
|---|---|---|---|
| 3,710,251 | 1/1973 | Hagge et al. | 324/760 |
| 4,038,599 | 7/1977 | Bove, et al. | |
| 5,321,453 | 6/1994 | Mori et al. | 324/754 |
| 5,416,592 | 5/1995 | Mori et al. | 356/399 |
| 5,521,522 | 5/1996 | Abe et al. | 324/754 |
| 5,539,324 | 7/1996 | Wood, et al. | |
| 5,610,529 | 3/1997 | Schwindt | 324/754 |
| 5,798,651 | 8/1998 | Aruga et al. | 324/754 |
| 5,886,535 | 3/1999 | Budnaitis | 324/760 |

FOREIGN PATENT DOCUMENTS

| | | |
|---|---|---|
| 4-302448 | 10/1992 | Japan . |
| 5-13524 | 1/1993 | Japan . |

OTHER PUBLICATIONS

Patent Abstracts of Japan, vol. 1995, No. 03, Apr. 28, 1995, JP 06 342832, Dec. 13, 1994.
Patent Abstracts of Japan, vol. 017, No. 576 (E–1451), Oct. 21, 1993, JP 05 175297, Jul. 13, 1993.
Patent Abstracts of Japan, vol. 013, No. 181 (E–750), Apr. 27, 1989, JP 01 008640, Jan. 12, 1989.

*Primary Examiner*—Josie Ballato
*Assistant Examiner*—Jermele M. Hollington
*Attorney, Agent, or Firm*—Oblon, Spivak, McClelland, Maier & Neustadt, P.C.

[57] ABSTRACT

A wafer inspecting apparatus inspects the electric characteristics of IC chips of a wafer W. The inspection is carried out by simultaneously examining the inspecting electrodes of all IC chips in a contact manner in the state where the wafer W is held on the main chuck. The wafer inspecting apparatus is provided with a contactor, and this contactor is made up of a first contactor, a second contactor and a driving mechanism. The first contactor has a large number of contact projections on the lower surface thereof and a large number of contact electrodes on the entire upper surface thereof. The contact projections are brought into simultaneous contact with the inspecting electrodes. The contact electrodes are electrically connected to the contact projections, respectively. The second contactor has a number of contact elements, such as pogo-pins, which are brought into contact with the contact electrodes of the first contactor. The second contactor is movable, and the driving mechanism moves this second contactor in the X- and Y-directions in such a manner that the contact elements and the contact electrodes are sequentially brought into contact with each other. The contactor may include a third contactor as well. The third contactor is arranged between the first contactor and the wafer W.

14 Claims, 2 Drawing Sheets

FIG. 2B to simply as "wafers"). More specifically, it relates to a wafer inspecting apparatus for inspecting the electric characteristics of a wafer by bringing the contact projections (probes) into simultaneous contact with the inspecting electrodes of all semiconductor integrated circuits (hereinafter referred to as "IC chips") that are formed on the surface of a wafer.

METHOD AND APPARATUS FOR INSPECTING SEMICONDUCTOR INTEGRATED CIRCUITS, AND CONTACTOR INCORPORATED IN THE APPARATUS

BACKGROUND OF THE INVENTION

1. Field of the Invention

The present invention relates to an inspecting apparatus for inspecting semiconductor wafers (hereinafter referred to as "wafers"). More specifically, it relates to a wafer inspecting apparatus for inspecting the electric characteristics of a wafer by bringing the contact projections (probes) into simultaneous contact with the inspecting electrodes of all semiconductor integrated circuits (hereinafter referred to as "IC chips") that are formed on the surface of a wafer.

2. Discussion of the Background

A conventional wafer inspecting apparatus (e.g., a prober) comprises the following: a cassette for storing wafers therein; a loader section for conveying the wafer between the cassette and an inspecting section; and a checking section (a prober section) for checking the electric characteristics of the wafer conveyed from the loader section. The loader section is provided with a conveyance mechanism (fork) and a sub-chuck. By the conveyance mechanism, the wafers stored in the cassette are conveyed to the loader section one by one. During the conveyance, a wafer is placed on the sub-chuck, on which it is preliminarily positioned (pre-alignment), with the orientation flat used as a reference. The prober section is provided with: a main chuck, movable in X-, Y-, Z- and θ-directions, for holding a wafer mounted thereon; an alignment mechanism; a probe card; and a tester. After being placed on the main chuck by the fork, a wafer is moved in the in X-, Y-, Z- and θ-directions by the alignment mechanism, in such a manner that the wafer is aligned with the probes. Thereafter, the wafer is index-fed in the X- and Y-directions, and the probes examine the IC chips formed on the wafer (probing). The tester has contact pins (e.g., pogo-pins) which correspond in number to the probes of the tester card. Electric signals are exchanged between the IC chips probed by the probes and the contact pins, and the tester connected to the contact pins inspects the electric characteristics of each IC chip. After the check, the wafer on the main chuck is returned into the cassette by the fork and the other wafers stored inside the cassettes are sequentially checked in a similar manner to that mentioned above.

The conventional wafer inspecting apparatus inspects the IC chips formed on a wafer one by one or in units of a predetermined number. If the wafer is large in diameter (the demand for large-diameter wafers is expected to grow in the future), a wide space is needed around the main chuck so as to enable the index feed of the wafer. Accordingly, the inspecting apparatus is inevitably large in size.

In addition to the growing demand for large-diameter wafers, there is also a demand for miniaturization for the wiring layers of the IC chips. For example, the wiring layers are required to be of the order of sub-quarter microns. Under the circumstances, the index feed must be controlled with very high accuracy.

In the conventional wafer inspecting apparatus, the main chuck is moved in the X- and Y-directions so as to index-feed the wafer. The driving mechanism for moving the main chuck inevitably produces particles, and such particles are likely to attach to the wafer. Some measures have to be taken against such particles, and taking such measures becomes more and more important in accordance with the current trend toward the miniaturization of the wiring layers.

In recent years, a new type of contactor is under development. It is designed to bring contact projections into simultaneous contact with the inspecting electrodes of all IC chips that are formed on a wafer. If such a contactor is realized, the inspection throughput could be remarkably improved. However, the realization of such a contactor does not necessarily solve the problems in the art. That is, the contact pins and wiring lines of a tester, which are connected to the contact projections that are brought into simultaneous contact with the inspecting electrodes of all IC chips, are very large in number. Roughly speaking, the number of contact pins or wiring lines which must be provided for the tester is in the range of 20,000 to 50,000. A tester presently available cannot cope with such a large number of contact pins or wiring lines; it can cope with thousands of contact pins at the most. Hence, there is an urgent demand for a wafer inspecting apparatus which can be used efficiently with a presently-available tester.

BRIEF SUMMARY OF THE INVENTION

The present invention has been conceived in an effort to solve one or more of the problems described above.

According to the first aspect of the present invention, there is provided an inspecting method which inspects the electric characteristics of the IC chips formed on a semiconductor wafer and which comprises: a step of placing a semiconductor wafer, on which IC chips having a plurality of inspecting electrodes are formed, on a main chuck; a contact step of moving the main chuck toward a contactor having a plurality of contact projections corresponding to the inspecting electrodes of the IC chips and bringing the contact projections into simultaneous contact with the inspecting electrodes of all IC chips that are formed on the semiconductor wafer; a step of sequentially outputting inspection signals of IC chips from the contact projections in a state where the contact projections are kept in contact with the inspecting electrodes of the IC chips; and sequentially inspecting the electric characteristics of each of the IC chips on the basis of the inspection signals.

The inspecting method according to the second aspect of the present invention is based on the method of the first aspect. In the inspecting method of the second aspect, the step of placing the semiconductor wafer on the main chuck includes a sub-step of storing the semiconductor wafer in a vessel which has an opening formed in an upper wall thereof and a sub-step of placing the vessel on the main chuck, and the contact step includes a sub-step of moving the main chuck toward a contactor which is capable of closing the opening of the vessel and which has a plurality of contact projections corresponding to the inspecting electrodes of the IC chips and a sub-step of bringing the contact projections into simultaneous contact with inspecting electrodes of the IC chips formed on the semiconductor wafer.

According to the third aspect of the present invention, there is provided an inspecting apparatus which inspects the electric characteristics of the IC chips formed on a semiconductor wafer and which comprises:

a main chuck for holding a semiconductor wafer on which IC chips having a plurality of inspecting electrodes are formed;

a contactor having a plurality of contact projections which are to be brought into contact with the inspecting electrodes of the IC chips, the contactor including a first contactor, a second contactor, and a second contactor-driving mechanism, the first contactor having a plurality of contact projections which are formed on a lower surface and which are to be brought into simultaneous contact with the inspecting electrodes of the IC chips formed on the semiconductor wafer, and a plurality of contact electrodes which are formed on an upper surface and which are electrically connected to the contact projections, respectively, the second contactor being arranged above the first contactor and having contact elements which are formed on a lower surface and which are to be brought into contact with part of the contact electrodes, the second contactor-driving mechanism being designed to move the second contactor above the first contactor such that the contact elements of the second contactor are sequentially brought into contact with the contact electrodes of the first contactor;

contacting means for bringing the contact projections of the first contactor into contact with the inspecting electrodes of the IC chips of the semiconductor wafer placed on the main chuck;

tester means for electrically inspecting the electric characteristics of each of the IC chips; and connecting means for electrically connecting the contact elements of the second contactor to the tester means.

The inspecting apparatus according to the fourth aspect of the present invention is based on the apparatus of the third aspect. In the inspecting apparatus of the fourth aspect, the contact electrodes are linearly arranged on the upper surface of the first contactor, and the contact elements are linearly arranged on the lower surface of the second contactor in such a manner that the arrangement of the contact elements corresponds to the arrangement of the contact electrodes.

According to the fifth aspect of the present invention, there is provided an inspecting apparatus which inspects the electric characteristics of the IC chips formed on a semiconductor wafer and which comprises:

a vessel having an opening formed in an upper wall thereof and storing a semiconductor wafer on which IC chips having a plurality of inspecting electrodes are formed;

a main chuck for holding the vessel that stores the semiconductor wafer;

a contactor having a plurality of contact projections which are to be brought into contact with the inspecting electrodes of the IC chips, the contactor including a first contactor, a second contactor, a third contactor, and a second contactor-driving mechanism, the third contactor being capable of closing the opening of the vessel, and having a plurality of second contact projections which are formed on a lower surface and which are to be brought into simultaneous contact with the inspecting electrodes of the IC chips formed on the semiconductor wafer, and a plurality of second contact electrodes which are formed on an upper surface and which are electrically connected to the second contact projections, respectively, the first contactor being arranged above the third contactor, and having a plurality of contact projections which are formed on a lower surface and which are to be brought into simultaneous contact with the second contact electrodes of the third contactor, and contact electrodes which are formed on an upper surface thereof and which are electrically connected to the contact projections, the second contactor being arranged above the first contactor and having contact elements which are formed on a lower surface and which are to be brought into contact with part of the contact electrodes, the second contactor-driving mechanism being designed to move the second contactor above the first contactor such that the contact elements of the second contactor are sequentially brought into contact with the contact electrodes of the first contactor;

contacting means for bringing the second contact projections of the third contactor into contact with the inspecting electrodes of the IC chips of the semiconductor wafer placed on the main chuck;

tester means for electrically inspecting the electric characteristics of each of the IC chips; and connecting means for electrically connecting the contact elements of the second contactor to the tester means.

The inspecting apparatus according to the sixth aspect of the present invention is based on the apparatus of the fifth aspect. The inspecting apparatus of the sixth aspect differs from that of the fifth aspect in that it further comprises means for introducing an inert gas into the vessel.

The inspecting apparatus according to the seventh aspect of the present invention is based on the apparatus of the fifth aspect. In the inspecting apparatus of the seventh aspect, the second contact electrodes are linearly arranged on the upper surface of the third contactor, and the contact projections are linearly arranged on the lower surface of the first contactor in such a manner that the arrangement of the contact projections corresponds to the arrangement of the second contact electrodes.

The inspecting apparatus according to the eighth aspect of the present invention is based on the apparatus of the fifth aspect. The inspecting apparatus of the eighth aspect differs from that of the fifth aspect in that the main chuck comprises temperature control means for controlling the temperature of the semiconductor wafer.

According to the ninth aspect of the present invention, there is provided an inspecting apparatus which inspects the electric characteristics of the IC chips on a semiconductor wafer in the state where the semiconductor wafer is held on a main chuck and which comprises:

a first contactor having a large number of contact projections which are formed on a lower surface and which are to be brought into simultaneous contact with the inspecting electrodes of the semiconductor elements, and a large number of contact electrodes which are formed on an upper surface and which are electrically connected to the contact projections, the contact electrodes being arranged at sufficiently long intervals in correspondence to arrangement of the contact projections;

a movable second contactor having a plurality of contact elements which are to be brought into contact with part of the contact electrodes of the first contactor; and a driving mechanism which moves the second contactor such that the contact elements are sequentially brought into contact with the contact electrodes.

According to tenth aspect of the present invention, there is provided an inspecting apparatus which inspects the electric characteristics of the semiconductor integrated circuits formed on a semiconductor wafer and which comprises:

a first contactor having a large number of contact projections which are formed on a lower surface and which correspond to the respective ones of the inspecting electrodes used for inspecting the semiconductor integrated circuits, and a large number of contact electrodes which are formed on an upper surface and which are electrically connected to the contact projections, the contact electrodes being arranged at sufficiently long intervals in correspondence to arrangement of the contact projections;

a movable second contactor having a plurality of contact elements which are to be brought into contact with part of the contact electrodes of the first contactor;

a driving mechanism which moves the second contactor such that the contact elements are sequentially brought into contact with the contact electrodes;

a vessel having an opening formed in an upper wall thereof and storing the semiconductor wafer; and a third contactor which closes the opening of the vessel, with the semiconductor wafer stored in the vessel, the third vessel having a large number of second contact projections which are formed on a lower surface and which are to be brought into simultaneous contact with the inspecting electrodes of the semiconductor integrated circuits, and a large number of second contact electrodes which are formed on an upper surface, electrically connected to the second contact projections, respectively, and brought into simultaneous contact with the contact projections of the first contactor.

The inspecting apparatus according to the eleventh aspect of the present invention is based on the apparatus of the tenth aspect. In the inspecting apparatus of the eleventh aspect, an inert gas is sealed in the vessel closed by the third contactor.

According to the twelfth aspect, there is provided a contactor which is used for inspecting the electric characteristics of the IC chips formed on a semiconductor wafer and which includes a firth contactor, a second contactor and a second contactor-driving mechanism, the first contactor having a plurality of contact projections which are formed on a lower surface and which are to be brought into simultaneous contact with the inspecting electrodes of the IC chips formed on the semiconductor wafer, and a plurality of contact electrodes which are formed on an upper surface and which are electrically connected to the contact projections, respectively, the second contactor being arranged above the first contactor and having contact elements which are formed on a lower surface and which are to be brought into contact with the contact electrodes, the contact elements being provided in such a manner as to correspond to the inspecting electrodes of at least one of the IC chips, and the second contactor-driving mechanism being designed to move the second contactor above the first contactor such that the contact elements of the second contactor are sequentially brought into contact with the contact electrodes of the first contactor.

The contactor according to the thirteenth aspect of the present invention is based on the contactor of the twelfth aspect. The contactor of the thirteenth aspect differs from that of the twelfth aspect in that it further comprises a third contactor. The third contactor is arranged under the first contactor and has a plurality of second contact projections which are formed on a lower surface and which are to be brought into simultaneous contact with the inspecting electrodes of the IC chips formed on the semiconductor wafer, and a plurality of second contact electrodes which are formed on an upper surface and which are electrically connected to the second contact projections, respectively. The contact projections on the lower surface of the first contactor are brought into simultaneous contact with the second contact electrodes of the third contactor.

The contactor according to the fourteenth aspect of the present invention is based on the contactor of the twelfth or thirteenth aspect. In the contactor of the fourteenth aspect, the contact electrodes are linearly arranged on the upper surface of the first contactor, and the contact elements are linearly arranged on the upper surface of the second contactor in such a manner that the arrangement of the contact elements corresponds to the arrangement of the contact electrodes.

In the present application, the term "contactor" is intended to refer to a mechanism for permitting electric measurement signals to be exchanged between the inspecting electrodes of the IC chips formed on a semiconductor wafer and the tester adapted for inspecting the electric characteristics of the IC chips.

In the present invention, the contact projections may be of any structure as long as they can be brought into electric contact with the inspecting electrodes. For example, bump-type projections or needle-like projections may be employed.

In the present invention, the inspecting electrodes are those electrodes which are used for the inspection of the electric characteristics of IC chips. The input/output electrodes of IC chips and electrodes provided exclusively for inspection are examples of such electrodes.

In the present invention, the contact electrodes on the upper surface of the first contactor may be arranged in any manner as long as they can be brought into contact with the contact elements of the lower surface of the second contactor. For example, they may be arranged in a similar manner to that of the inspecting electrodes formed on the IC chips. Alternatively, they may be arranged linearly.

Likewise, the second contact electrodes on the upper surface of the third contactor may be arranged in any manner as long as they can be brought into contact with the contact projections provided on the lower surface of the first contactor. For example, the second contact electrodes may be arranged in a similar manner to that of the inspecting electrodes formed on the IC chips. Alternatively, they may be arranged linearly.

In the present invention, the second contactor driving mechanism may be of any type as long as they can move the second contactor in both X- and Y-directions. For example, it may be a mechanism employing ball screws, a mechanism employing wires, or a mechanism provided with a linear motor.

In the present invention, the open-top vessel for storing semiconductor wafers may be of any structure as long as a semiconductor wafer can be reliably stored therein. The material of which to form the vessel and the shape of the vessel may be determined arbitrarily.

In the present invention, the third contactor can be mounted on the vessel at a variety of timings. This operation can be performed by use of either a sub-chuck or a main chuck.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention, in which.

DETAILED DESCRIPTION OF THE INVENTION

Preferred embodiments of the present invention will now be described with reference to the accompanying drawings.

Figure 1:
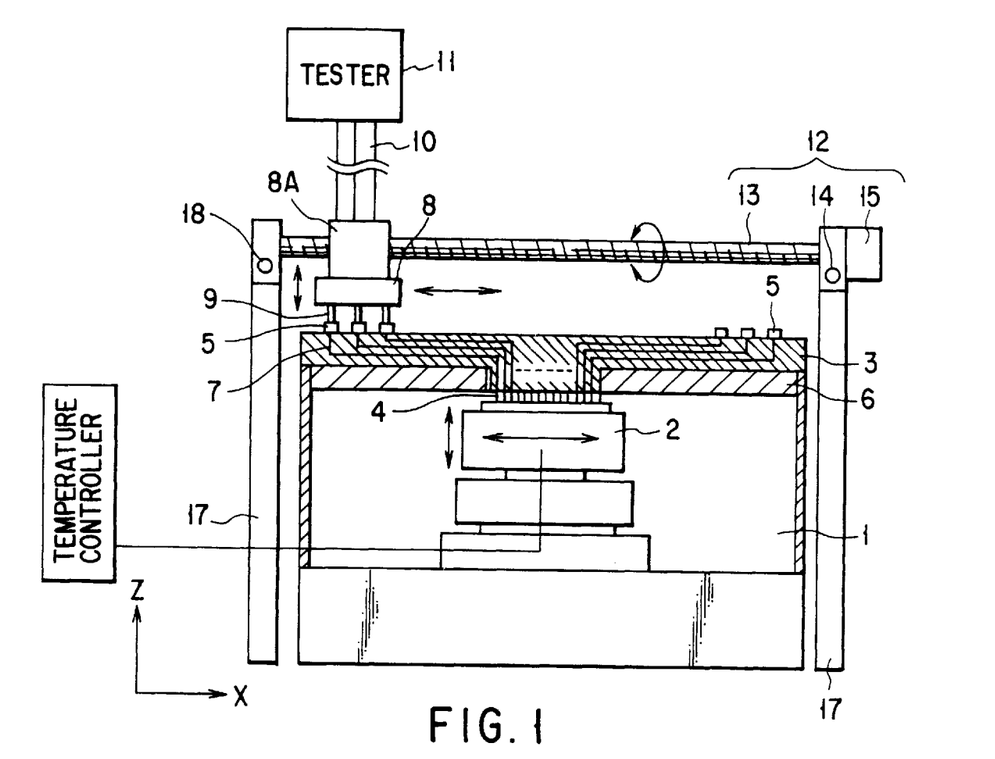
FIG. 1 is a front view showing the major portion of the wafer inspecting apparatus according to the first embodiment of the present invention.

Referring first to FIG. 1, a wafer inspecting apparatus is provided with a prober chamber 1. In this chamber 1, a main chuck 2 movable in X-, Y-, Z- and θ-directions and a contactor (3, 4, 5, 8, 9) having contact projections 4 are arranged. A wafer W is mounted on the main chuck 2. As described later, the IC chips on the wafer are subjected to electric inspection in the state where the inspecting electrodes (electrode pads) of the IC chips are in contact with the contact projections 4 of the contactor. This inspection process is controlled by a controller (not shown) that operates based on a predetermined program. Although not shown, a loader chamber is located adjacent to the prober chamber 1. Inside the loader chamber, a cassette for storing wafers W therein, a fork, and a sub-chuck are arranged. The wafers W are taken out of the cassette one by one by means of the fork, and the wafer W taken out of the cassette is placed on the sub-chuck. After being pre-aligned on the sub-chuck, the wafer W is conveyed onto the main chuck 1 arranged in the prober chamber 1. An alignment mechanism (not shown) is arranged inside the prober chamber 1. The alignment mechanism 1 is made mainly of a CCD camera and aligns the electrode pads of the wafer W with the contact electrodes 4 of the contactor.

The contactor is made up of a first contactor 3 and a second contactor 8. The first contactor 3 comprises contact electrodes 5 in addition to the contact projections mentioned above. The second contactor 8 comprises contact elements 9 and a cable 10.

The first contactor 3 is made of a printed circuit board. As shown in FIG. 1, the size of the first contactor 3 is substantially equal to that of the upper surface of the prober chamber 1, but may be determined in accordance with the requirements. The first contactor 3 has a circular projected portion on the lower surface thereof. The contact projections 4 mentioned above are arranged on the lower surface of this circular projected portion. The contact projections 4 are arranged at a pitch of 200 μm, and each of them is 100 μm by 100 μm. Each contact projection 4 is coated with a conductive metal, such as gold. The number of contact projections 4 provided is determined such that they can be brought into simultaneous contact with the inspecting electrodes of one or a number of IC chips formed on the wafer W. The first contactor 3 has a plurality of contact electrodes 5 on the upper surface thereof. Each contact electrode 5 is coated with a conductive metal, such as gold. The contact electrodes 5 are electrically connected to the respective contact projections.

The first contact 3 is supported on a support plate 6.

The support plate 6 has a circular hole substantially in the center thereof. The diameter of this circular hole is slightly greater than that of the wafer W. The circular projected portion of the first contactor 3 is fitted in the circular hole of the support plate 6.

The contact electrodes 5 are located on the upper surface of the first contactor 3. Although the contact electrodes 5 are electrically connected to the contact projections 4 by way of internal wiring lines 7, the arrangement of the contact electrodes 5 is in no way restricted by the arrangement of the contact projections 4. That is, the contact electrodes 5 can be arranged in an arbitrary manner. For example, they may be arranged in a similar manner to that of the inspecting electrodes of the wafer W. Alternatively, they may be arranged in a different manner from that of the inspecting electrodes, for example in a linear manner. The contact electrodes 5 may be arranged either on the entire upper surface of the first contactor or on part of the upper surface. In order to ensure reliable electric connection to the contact elements, it is desirable that the area in which to arrange the contact electrodes 5 be greater than the area of the circular projected portion of the first contactor 3 and that the size and arrangement pitch of the first contact electrodes 5 be greater than the size of the contact projections 4.

Figure 2A:
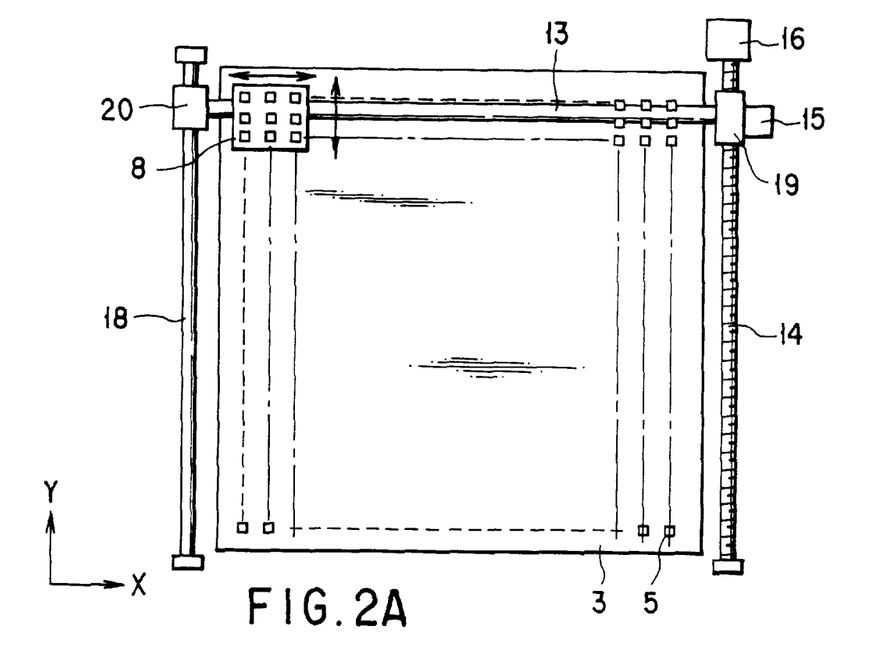
FIGS. 2A and 2B are plan views of the first contactor applicable to the wafer inspecting apparatus shown in FIG. 1.
Figure 2B:
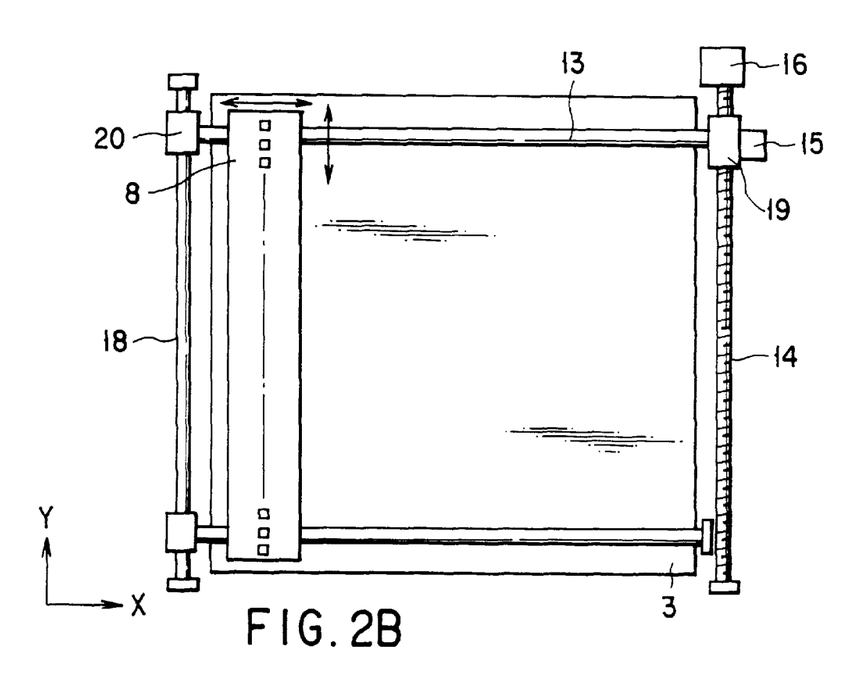

The second contactor 8 is located above the first contactor 3 and is driven in X- and Y-directions by a driving mechanism 12 (FIGS. 2A and 2B). When the second contactor 8 is moved, its contact elements 9 are sequentially brought into electric contact with the contact electrodes 5 provided on the upper surface of the first contactor 3. To be more specific, the contact elements 9 (such as pogo-pins) are located on the lower surface of the second contactor 8, and the contact electrodes 5 to be touched by the contact elements 9 are far larger than the electrode pads of an IC chip. The contact elements 9 are brought into electric contact with the contact electrodes 5 of one IC chip or those of a number of IC chips. In this connection, it should be noted that the conventional wafer inspecting apparatus has to index-feed a wafer by means of the main chuck so that the probe needles perform probing. Such an index-feed is not required in the case of the present invention. According to the present invention, the main chuck and the first contactor 3 are kept stationary when the contact projections 4 are in contact with the inspecting electrodes of all IC chips. In this state, the second contactor 8 is moved so as to probe the contact electrodes 5 by means of the contact elements 9. The second contactor 8 is electrically connected to a tester 11 by means of the cable 10, and one IC chip or a number of IC chips are inspected each time the contact elements 9 of the second contactor 8 are brought into contact with the contact electrodes 5 of the first contactor 3.

Like the contact electrodes 5 of the first contactor 3, the contact elements of the second contactor 8 can be arranged freely in accordance with the manner in which the contact electrodes 5 are arranged. In other words, even where the IC chips to be tested are different in the arrangement of electrode pads, the arrangements of the contact electrodes 5 and contact elements 9 need not be changed as long as the IC chips are the same in the number of electrode pads provided. To be brief, the first and second contactors 3 and 8 can be standardized in design. Hence, a variety of IC chips can be tested by use of the same second contactors 8.

The manner in which to arrange the contact elements 9 of the second contactor 8 and the driving mechanism 12 by which to move the second contactor 8 in the X- and Y-directions will now be described with reference to FIGS. 2A and 2B. The contact elements 9 of the second contactor 8 may be projections of any structure as long as they can be brought into electric contact with the contact electrodes. For example, bump-type projections, needle-like projections or pogo-pins may be employed as the contact elements 9. The contact elements 9 can be freely arranged in accordance with the arrangement of the contact electrodes 5. The contact elements 9 are arranged in a matrix pattern in the case shown in FIG. 2A, and are arranged in a linear manner in the case shown in FIG. 2B. Likewise, the contact electrodes 5 are arranged in a matrix pattern in the case shown in FIG. 2A, and are arranged in a linear manner in the case shown in FIG. 2B. The contact elements can be moved up or down (i.e., in the Z-direction) by means of a lift mechanism (not shown).

The driving mechanism 12 may be a mechanism employing ball screws, a mechanism employing wires, or a mechanism provided with a linear motor. Although the mechanism employing ball screws will be referred to in the descriptions below, the mechanisms of the other types are applicable to the present invention as long as they can accurately move the second contactor 8 in the X- and Y-direction.

The driving mechanism 12 comprises an X-direction ball screw 13 and a Y-direction ball screw 14, and X- and Y-direction motors 15 and 16 for rotating these ball screws. The X-direction ball screw 13 is located above the prober chamber 1 and extends in the X-direction. The X-direction ball screw 13 is supported at the upper ends of support frames 17, which are arranged on the right and left sides of the prober chamber 1. The Y-direction ball screw 14 is supported at the upper end of the right-side support frame 17 and extends in the Y-direction. A guide rod 18 is supported at the upper end of the left-side support frame 17 in such a manner that it opposes the Y-direction ball screw 14 and extends in the Y-direction. One end of the X-direction ball screw 13 is coupled to a nut 19 which threadably engages with the Y-direction ball screw 14, while the other end is coupled to the guide rod 18 by means of a coupling member 20. When the Y-direction ball screw 14 rotates, the X-direction ball screw 13 moves to and fro in the Y-direction. One end of the second contactor 8 is attached to the X-direction ball screw 13 by means of a nut 8A (FIG. 1). The other end of the second contactor 8 can be attached to an X-direction guide rod (FIG. 2B) arranged in opposition to the X-direction ball screw 13. When the X-direction ball screw 13 rotates, the second contactor 8 moves to and fro in the X-direction. In the manner described above, the second contactor 8 is movable in the X- and Y-directions by means of the X- and Y-direction ball screws 13 and 14 rotated by the X- and Y-direction motors 15 and 16.

A description will now be given as to how the above-mentioned wafer checking apparatus operates. Inside the loader chamber (not shown), the fork takes one wafer W out of the cassette and places it on the sub-chuck. The wafer W is pre-aligned on the sub-chuck. Then, the wafer W is conveyed into the prober chamber 1 and placed on the main chuck 2 by the fork. The main chuck 2 is movable in the X-, Y-, Z- and θ-directions in the prober chamber 1, and cooperates with the alignment mechanism (not show) such that the inspecting electrodes of the IC chips formed on the wafer W are aligned, and the with the contact projections 4 of the first contactor. After this alignment, the main chuck 2 is lifted in the Z-direction and the inspecting electrodes of all IC chips are brought into contact with the contact projections 4 of the first contactor 3.

The second contactor 8 is moved in the X- and Y-directions by the driving mechanism 12 in the state where the inspecting electrodes of the IC chips of the wafer W are in contact with the contact projections 4 of the first contactor 3.

The contact elements 9 of the second contactor 8 probe the contact electrodes 5 of the first contactor 3. In the conventional wafer inspecting apparatus, a wafer is indexfed by moving the main chuck. In the above-mentioned embodiment of the present invention, however, the first contactor is not moved. Instead, the second contactor 8 is moved in the X- and Y-directions, and this movement causes the contact elements 9 (e.g., pogo-pins) to probe the contact electrodes 5 of the first contactor 3. In this manner, the IC chips on the wafer W are inspected one by one, or a number of IC chips at one time.

The contact electrodes 5 are larger than the inspecting electrodes of the IC chips. In addition, they can be arranged, with a proper interval maintained.

Accordingly, they can be easily aligned with the contact elements 9 (e.g., pogo-pins) or brought into electric contact therewith.

As can be seen from the foregoing, the embodiment described above enables the contact elements 9 to be aligned with the contact electrodes 5 very easily.

According to the above embodiment, all IC chips on the wafer W can be inspected by merely moving the second contactor 8 above the first contactor 3. Since the second contactor 8 is only required to move within the area defined by the first contactor 3, the main chuck 2, which holds the wafer thereon, need not be moved in the X-, Y- and θ-directions, as in the conventional art. Hence, the size of footprints in the prober chamber 1 can be remarkably reduced.

Since the main chuck 2 is kept stationary during the inspection of the wafer W, the generation of particles in the prober chamber 1 can be remarkably suppressed.

Since the contact electrodes 5 of the first contactor 3 can be arranged without reference to the arrangement of the electrode pads of the IC chips on the wafer W, the first contactor 3 can be standardized in the arrangement of the contact electrodes 5.

Accordingly, the first contactor 3 can be designed with a high degree of freedom.

Figure 3:
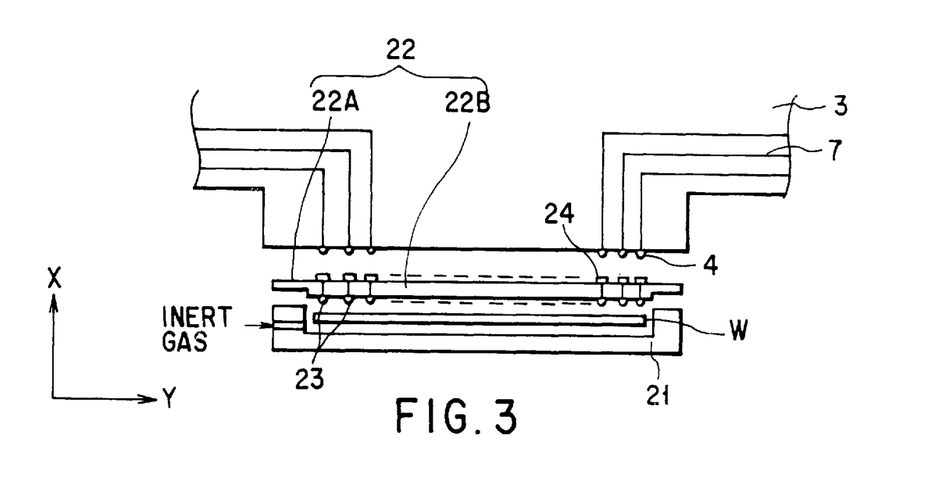
FIG. 3 is a sectional view showing another type of contactor which is applicable to the wafer inspecting apparatus of the present invention.

FIG. 3 is a sectional view showing another embodiment of the present invention. The wafer inspecting apparatus shown in FIG. 3 is similar to that shown in FIG. 1, except that the wafer W is stored in the vessel 21 and that the contactor 22 includes a third contactor. The embodiment shown in FIG. 3 will therefore be described, referring mainly to the vessel 21 and the third contactor 22.

The outward form and size of the vessel 21 and the material used for forming it can be arbitrarily determined.

Referring to FIG. 3, the vessel 21 is flat and circular and has a diameter permitting a wafer W to be stored therein.

The third contactor 22 has second contact projections 23 on the lower surface thereof. The second contact projections 23 are arranged in accordance with the inspecting electrodes of the IC chips of the wafer W. The second contact projections 23 are formed of a conductive metal, such as gold, or have a coating of such a metal, and are brought into contact with the inspecting electrodes of the IC chips of the wafer W. The third contactor 22 has second contact electrodes 24 on the upper surface thereof. The second contact electrodes 24 are arranged in accordance with the contact electrodes of the third contactor. The second contact electrodes 24 are formed of a conductive metal, such as gold, or have a coating of such a metal. The contact projections 4 of the first contactor 3 are brought into contact with the second contact electrodes 24.

The third contactor 22 can have an arbitrarily determined shape, such as a circular shape or a square shape. It can be made of a transparent glass substrate. It is preferable that the third contactor 22 serves as a lid of the vessel 21. In this case, the third contactor 22 has a thin portion 22A at the periphery and a thick portion 22B in the center.

The opening of the vessel 21 is closed by the third contactor 22, and the vessel 21 is sealed thereby. The third contactor 22 is prevented from separating from the vessel 21 by a clamping mechanism (not shown).

The vessel 21 is sealed by the third contactor 22, with the wafer W stored therein. The second contact projections 23 of the third contactor 22 are brought into contact with the inspecting electrodes of the IC chips. When or after the wafer W is sealed in the vessel 21, an inert gas or nitrogen gas is preferably introduced into the interior of the vessel 21, for the prevention of oxidation.

Before the wafer W is sealed in the vessel 21, the inspecting electrodes of the IC chips and the second contact projections 23 of the third contactor 22 are aligned with each other by an alignment mechanism (not shown).

Although not shown, a cutout section may be provided at the periphery of the vessel 21, for allowing fork to pass therethrough. In this case, a projection that conforms with the cutout section is formed on the thin portion of the third contactor 22. With this structure, a wafer W can be easily inserted or taken out from the vessel 21.

The vessel 21 may have a gas inlet/output port at the periphery. An inert gas can be easily introduced or exhausted from the vessel through that gas inlet/outlet port.

To inspect a wafer W, it is stored in the vessel 21 beforehand. After the wafer W is stored in the vessel 21, the inspecting electrodes of the wafer and the second contact projections 23 of the third contactor 22 are aligned with each other by the alignment mechanism. Thereafter, the vessel 21 is sealed by the third contactor 22, and the wafer W is secured inside the vessel 21 in the state where the second contact projections 23 are in contact with the inspecting electrodes of the IC chips. Then, nitrogen gas is introduced into the vessel 21, for the prevention of oxidation.

The vessel 21 is placed on the main chuck 2, and the second contact electrodes 24 of the third contactor 22 and the first contact projections 4 of the first contactor 3 are aligned with each other by the alignment mechanism. Then, the main chuck 2 is moved up until the second contact projections 24 touch the contact projections 4. Thereafter, the second contactor 8 is moved and the IC chips are inspected in the same manner as in the embodiment shown in FIG. 1.

In the embodiment shown in FIG. 3, the IC chips are inspected in the nitrogen gas atmosphere sealed in the vessel 21. Since natural oxidation of the electrode pads of the IC chips is prevented, very reliable inspection is ensured.

Since the wafer W is sealed in the vessel 21, particles are reliably prevented from attaching to the wafer W in the prober chamber 1.

The present invention is in no way limited to the embodiments mentioned above. For example, IC chips formed on a wafer W can be inspected by bringing the contact projections 4 of the first contactor 3 into simultaneous contact with the inspecting electrodes of the IC chips and by sequentially bringing the contact elements 9 of the second contactor 8 into contact with the contact electrodes 5 formed on the upper surface of the first contactor 3. An apparatus for inspecting the IC chips in this fashion is within the spirit and scope of the present invention.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. An inspecting method for inspecting electric characteristics of semiconductor integrated circuits formed on a semiconductor wafer, said inspecting method comprising:

a step of placing said semiconductor wafer, on which semiconductor integrated circuits having a plurality of inspecting electrodes are formed, on a main chuck;

a contact step of moving the main chuck toward a first contactor having a plurality of contact projections formed on a lower surface, said plurality of contact projections corresponding to the inspecting electrodes of the semiconductor integrated circuits and bringing the contact projections into simultaneous contact with the inspecting electrodes of all of the semiconductor integrated circuits formed on the semiconductor wafer; and     a moving step of moving a second contractor above the first contactor in such a manner that contact elements, which are formed on a lower surface of the second contractor, are sequentially brought into contact with contact electrodes of the first contactor step by step,     in said moving step,     a step of sequentially outputting inspection signals of the semiconductor integrated circuits by the contact element of the second contactor from the contact projections in a state where the contact projections are kept in contact with the inspecting electrodes of the semiconductor integrated circuits; and     sequentially inspecting the electric characteristics of each of the semiconductor integrated circuits on the basis of the inspection signals.

2. An inspecting method according to claim 1, wherein:

the step of placing the semiconductor wafer on the main chuck includes a sub-step of storing the semiconductor wafer in a vessel which has an opening formed in an upper wall thereof, and a sub-step of placing the vessel on the main chuck; and     the contact step includes a sub-step of moving the main chuck toward a contactor which is capable of closing the opening of the vessel and which has a plurality of contact projections corresponding to the inspecting electrodes of the semiconductor integrated circuits, and a sub-step of bringing the contact projections into simultaneous contact with the inspecting electrodes of all of the semiconductor integrated circuits formed on the semiconductor wafer.

3. An inspecting apparatus for inspecting electric characteristics of semiconductor integrated circuits formed on a semiconductor wafer, said inspecting apparatus comprising;

a main chuck for holding said semiconductor wafer on which semiconductor integrated circuits having a plurality of inspecting electrodes are formed;

a contactor having a plurality of contact projections which are to be brought into contact with the inspecting electrodes of the semiconductor integrated circuits, said contactor including a first contactor, a second contactor, and a second contactor-driving mechanism,     said first contactor having said plurality of contact projections which are formed on a lower surface and which are to be brought into simultaneous contact with the inspecting electrodes of all of the semiconductor integrated circuits formed on the semiconductor wafer, and a plurality of contact electrodes which are formed on an upper surface and which are electrically connected to the contact projections, respectively, said second contactor being arranged above the first contactor and having contact elements which are formed on a lower surface and which are to be brought into contact with part of the contact electrodes, said second contactor-driving mechanism comprising X- and Y-direction motors for moving the second contactor above the first contactor such that the contact elements of the second contactor are sequentially brought into contact with the contact electrodes of the first contactor;

contacting means for bringing the contact projections of the first contactor into contact with the inspecting electrodes of the semiconductor integrated circuits of the semiconductor wafer placed on the main chuck; and tester means for electrically inspecting the electric characteristics of each of the semiconductor integrated circuits.

4. An inspecting apparatus according to claim 3, wherein said contact electrodes are linearly arranged on the upper surface of the first contactor, and said contact elements are linearly arranged on the lower surface of the second contactor such that arrangement of the contact elements corresponds to arrangement of the contact electrodes.

5. An inspecting apparatus for inspecting electric characteristics of semiconductor integrated circuits formed on a semiconductor wafer, said inspecting apparatus comprising:

a vessel having an opening formed in an upper wall thereof and storing said semiconductor wafer on which semiconductor integrated circuits having a plurality of inspecting electrodes are formed;

a main chuck for holding the vessel that stores the semiconductor wafer therein;

a contactor having a plurality of contact projections which are to be brought into contact with the inspecting electrodes of the semiconductor integrated circuits, said contactor including a first contactor, a second contactor, a third contactor, and a second contactor-driving mechanism, said third contactor being capable of closing the opening of the vessel, and having a plurality of second contact projections which are formed on a lower surface and which are to be brought into simultaneous contact with the inspecting electrodes of the semiconductor integrated circuits formed on the semiconductor wafer, and a plurality of second contact electrodes which are formed on an upper surface and which are electrically connected to the second contact projections, respectively, said first contactor being arranged above the third contactor, and having a plurality of contact projections which are formed on a lower surface and which are to be brought into simultaneous contact with the second contact electrodes of the third contactor, and contact electrodes which are formed on an upper surface thereof and which are electrically connected to the contact projections, said second contactor being arranged above the first contactor and having contact elements which are formed on a lower surface and which are to be brought into contact with part of the contact electrodes, said second contactor-driving mechanism being for moving the second contactor above the first contactor such that the contact elements of the second contactor are sequentially brought into contact with the contact electrodes of the first contactor;

wherein the inspecting electrodes formed on the semiconductor wafer stored in the vessel are brought into electric contact with tester means through the third contactor, the first contactor, and the second contactor.

6. An inspecting apparatus according to claim 5, further comprising means for introducing an inert gas into the vessel.

7. An inspecting apparatus according to claim 5, wherein said second contact electrodes are linearly arranged on the upper surface of the third contactor, and said contact projections are linearly arranged on the lower surface of the first contactor such that arrangement of the contact projections corresponds to arrangement of the second contact electrodes.

8. An inspecting apparatus according to claim 5, wherein said main chuck includes temperature control means for controlling temperature of the semiconductor wafer.

9. An inspecting apparatus for inspecting electric characteristics of semiconductor elements on a semiconductor wafer which is held on a main chuck, said inspecting apparatus comprising:

a first contactor having a large number of contact projections which are formed on a lower surface and which are to be brought into simultaneous contact with the inspecting electrodes of all of the semiconductor elements, and a large number of contact electrodes which are formed on an upper surface and which are electrically connected to the contact projections, said contact electrodes being arranged at sufficiently long intervals in correspondence to arrangement of the contact projections;

a movable second contactor having a plurality of contact elements which are to be brought into contact with part of the contact electrodes of the first contactor; and a driving mechanism for moving the second contactor such that the contact elements are sequentially brought into contact with the contact electrodes.

10. An inspecting apparatus for inspecting electric characteristics of semiconductor elements formed on a semiconductor wafer, said inspecting apparatus comprising:

a first contactor having a large number of contact projections which are formed on a lower surface and which correspond to respective ones of inspecting electrodes used for inspecting the semiconductor elements, and a large number of contact electrodes which are formed on an upper surface and which are electrically connected to the contact projections, said contact electrodes being arranged at sufficiently long intervals in correspondence to arrangement of the contact projections;

a movable second contactor having a plurality of contact elements which are to be brought into contact with part of the contact electrodes of the first contactor;

a driving mechanism for moving the second contactor such that the contact elements are sequentially brought into contact with the contact electrodes;

a vessel having an opening formed in an upper wall thereof and storing the semiconductor wafer therein; and a third contactor which closes the opening of the vessel, with the semiconductor wafer stored in the vessel, said third contactor having a large number of second contact projections which are formed on a lower surface and which are to be brought into simultaneous contact with the inspecting electrodes of the semiconductor elements, and a large number of second contact electrodes which are formed on an upper surface, electrically connected to the second contact projections, respectively, and brought into simultaneous contact with the contact projections of the first contactor.

11. An inspecting apparatus according to claim 10, wherein the vessel closed by the third contactor contains an inert gas sealed therein.

12. A contactor used for inspecting electric characteristics of semiconductor integrated circuits formed on a semiconductor wafer, said contactor comprising a first contactor, a second contactor, and a second contactor-driving mechanism, said first contactor having a plurality of contact projections which are formed on a lower surface and which are to be brought into simultaneous contact with inspecting electrodes of all of the semiconductor integrated circuits formed on the semiconductor wafer, and a plurality of contact electrodes which are formed on an upper surface and which are electrically connected to the contact projections, respectively, said second contactor being arranged above the first contactor and having contact elements which are formed on a lower surface and which are to be brought into contact with part of the contact electrodes, and said second contactor-driving mechanism comprising X- and Y-direction motors for moving the second contactor above the first contactor such that the contact elements of the second contactor are sequentially brought into contact with the contact electrodes of the first contactor.

13. A contactor according to claim 12, further comprising a third contactor, said third contactor being arranged under the first contactor and having a plurality of second contact projections which are formed on a lower surface and which are to be brought into simultaneous contact with the inspecting electrodes of all of the semiconductor integrated circuits formed on the semiconductor wafer, and a plurality of second contact electrodes which are formed on an upper surface and which are electrically connected to the second contact projections, respectively, and the contact projections on the lower surface of the first contactor being brought into simultaneous contact with the second contact electrodes of the third contactor.

14. A contactor according to any one of claims 12 and 13, wherein said contact electrodes are linearly arranged on the upper surface of the first contactor, and said contact elements are linearly arranged on the upper surface of the second contactor such that arrangement of the contact elements corresponds to arrangement of the contact electrodes.

* * * * *